US007348868B2

(12) United States Patent
Urano et al.

(10) Patent No.: US 7,348,868 B2
(45) Date of Patent: Mar. 25, 2008

(54) PASSIVE COMPONENT HAVING STACKED DIELECTRIC LAYERS

(75) Inventors: Masaki Urano, Saku (JP); Takami Hirai, Saku (JP); Yasuhiko Mizutani, Saku (JP); Kouhei Takase, Saku (JP)

(73) Assignee: Soshin Electric Co., Ltd., Saku (JP)

( * ) Notice: Subject to any disclaimer, the term of this patent is extended or adjusted under 35 U.S.C. 154(b) by 94 days.

(21) Appl. No.: 10/551,273

(22) PCT Filed: Apr. 1, 2004

(86) PCT No.: PCT/JP2004/004765

§ 371 (c)(1),
(2), (4) Date: Sep. 28, 2005

(87) PCT Pub. No.: WO2004/091036

PCT Pub. Date: Oct. 21, 2004

(65) Prior Publication Data

US 2006/0192637 A1 Aug. 31, 2006

(30) Foreign Application Priority Data

Apr. 1, 2003 (JP) ............................ 2003-098608

(51) Int. Cl.
*H03H 7/01* (2006.01)

(52) U.S. Cl. ......................... 333/204; 333/25; 333/185

(58) Field of Classification Search ................ 333/158, 333/204, 25, 185

See application file for complete search history.

(56) References Cited

U.S. PATENT DOCUMENTS 5,760,666 A 6/1998 Tada et al.
5,834,994 A 11/1998 Shapiro
5,977,850 A * 11/1999 Chaturvedi ................. 333/238
6,222,427 B1 4/2001 Kato et al. .................. 333/185
6,222,430 B1 4/2001 Horie et al.
6,483,404 B1 11/2002 Ammar et al.
6,828,881 B2 * 12/2004 Mizutani et al. ............ 333/204
6,850,127 B2 * 2/2005 Sakakura et al. ............. 333/25
6,977,564 B2 * 12/2005 Kanba et al. ............... 333/204
2005/0088258 A1 * 4/2005 Fischer ....................... 333/204

FOREIGN PATENT DOCUMENTS

CN 1274476 A 11/2000
EP 1 094 538 4/2001
EP 1 265 311 12/2002

(Continued)

*Primary Examiner*—Benny Lee
(74) *Attorney, Agent, or Firm*—Burr & Brown

(57) ABSTRACT

A passive component comprising one input electrode layer constituting an input terminal, one output electrode layer constituting an output terminal, and four shield electrode layers constituting shield terminals, all formed in the lowermost dielectric layer by via holes. The input electrode layer is connected electrically with an input-side resonance electrode, in the vicinity of the second side face of a dielectric substrate, through a via hole made in the fourth through sixth dielectric layers and an input tap electrode. The output electrode layer is connected electrically with an output-side resonance electrode, in the vicinity of the third side face of the dielectric substrate, through a via hole made in the fourth through sixth dielectric layers and an output tap electrode.

9 Claims, 8 Drawing Sheets

FOREIGN PATENT DOCUMENTS

| | | | |
|---|---|---|---|
| EP | 1 267 438 | A1 | 12/2002 |
| JP | 05-275903 | A1 | 10/1993 |
| JP | 06-097705 | | 4/1994 |
| JP | 06-104606 | A1 | 4/1994 |
| JP | 07-007306 | | 1/1995 |
| JP | 08-032308 | | 2/1996 |
| JP | 08-087787 | | 4/1996 |
| JP | 09-214204 | | 8/1997 |
| JP | 10-028006 | A1 | 1/1998 |
| JP | 10-150138 | A1 | 6/1998 |
| JP | 10-335903 | | 12/1998 |
| JP | 2000-151206 | A1 | 5/2000 |
| JP | 2000-165171 | A1 | 6/2000 |
| JP | 3127792 | B2 | 11/2000 |
| JP | 2002-261643 | A1 | 9/2002 |
| JP | 2002-270465 | | 9/2002 |
| JP | 2002-280805 | A1 | 9/2002 |
| JP | 2003-078103 | | 3/2003 |
| JP | 2003-086755 | | 3/2003 |
| JP | 2003-087005 | | 3/2003 |
| WO | WO 01/69710 | A1 | 9/2001 |

* cited by examiner

10B

PASSIVE COMPONENT HAVING STACKED DIELECTRIC LAYERS

TECHNICAL FIELD

The present invention relates to a passive component such as a multilayered dielectric filter for resonant circuits for use in a microwave band ranging from several hundred MHz to several GHz, and more particularly to a passive component which is effective in making communication devices and electronic devices small in size.

BACKGROUND ART

Recently, ICs have been highly integrated and fast becoming smaller in size. Passive components such as filters for use with ICs have also become smaller in size. Multilayered dielectric passive components employing dielectric substrates are effective in making passive components smaller in size (see, for example, Japanese Laid-Open Patent Publication No. 2002-280805 and Japanese Laid-Open Patent Publication No. 2002-261643).

When a multilayered dielectric passive component is mounted on a wiring board, for example, a wiring pattern disposed on the wiring board and input and output terminals disposed on sides of the multilayered dielectric passive component are electrically connected to each other by soldering or the like (side mounting).

Heretofore, it has also been proposed to use terminals disposed on outer peripheral surfaces of a chip-like electronic component as portions of lower surface electrodes for surface mounting (see, for example, Japanese Laid-Open Patent Publication No. 10-150138).

For mounting a product on a wiring board, the product may be electrically connected by wire bonding or lead wires rather than the side mounting referred to above. Particularly, the side mounting is a main process for mounting passive components.

However, the above side mounting suffers the following problems:

(1) A wide mounting area is necessary. Specifically, a mounting area greater than the area of a mounted surface of the passive component (e.g., a mounting area which is about 1.5 times the mounted surface) is necessary.

(2) Isolation characteristics are degraded by the stray capacitance of electrodes (side electrodes) disposed on side surfaces of the passive component.

(3) Many manufacturing steps are required due to the need for providing side electrodes on side surfaces of the passive component.

(4) Characteristic variations occur because of shield plates installed near the passive component and other adjacent components.

The present invention has been made in view of the above drawbacks. It is an object of the present invention to provide a passive component which will solve the various problems of the side mounting and which is effective in suppressing characteristic variations and simplifying manufacturing steps.

SUMMARY OF THE INVENTION

According to the present invention, a passive component includes a plurality of electrodes and at least one terminal extending outwardly, which serve as a passive circuit, in a dielectric substrate made up of a plurality of stacked dielectric layers. The terminal is provided only on a lower surface of the dielectric substrate.

When the passive component is mounted on a wiring board or the like, for example, the terminal disposed only on the lower surface of the dielectric substrate is mounted on the wiring board by a surface mounting process. Therefore, the mounting area of the passive component may be smaller than if it is mounted by a side mounting process.

Since the terminal is provided only on the lower surface of the dielectric substrate, the area of a plurality of electrodes is reduced, making it less liable to produce stray capacitances between the terminal and the electrodes. Therefore, the isolation characteristics of the passive component are improved.

As no electrodes need to be formed on the side surfaces of the passive component, the passive component can be manufactured by simple manufacturing steps at a reduced cost.

The passive component is less susceptible to shields disposed closely thereto and other adjacent components, and suffers smaller characteristic variations.

In the above arrangement, at least one terminal preferably includes a plurality of terminals for inputting and outputting signals and at least one shield terminal, the shield terminal being arranged between the terminals for inputting and outputting signals on the lower surface of the dielectric substrate. The terminals for inputting and outputting signals are therefore kept isolated from each other.

In the above arrangement, the terminal may be provided by an electrode in a via hole in the dielectric substrate. Therefore, the terminal is prevented from being peeled off from the dielectric substrate, and cracking of the electrode is reduced. Since the electrode can be formed simultaneously with the via hole in the dielectric substrate, the step of forming the terminal on the lower surface of the dielectric substrate is dispensed with, resulting in simplified manufacturing steps. As the thickness of the electrode can be increased, the electrode can have the same mechanical strength as conventional side terminals.

If the dielectric substrate has therein at least one via hole for electrically interconnecting a plurality of electrodes, the electrode as the terminal preferably has a diameter greater than the diameter of the via hole. Consequently, the area in which a wiring pattern on a wiring board and the terminal face each other is increased to reduce an unwanted inductive component.

In the above arrangement, the terminal may be provided by an electrode on the lower surface of the dielectric substrate, and the dielectric substrate may have a shield electrode disposed therein.

In the above arrangement, of the dielectric layers which make up the dielectric substrate, the dielectric layer between the shield electrode and the lower surface of the dielectric substrate may have a dielectric constant $\in r<20$. In this case, stray capacitance between the shield electrode and the terminal is reduced, thereby improving isolation characteristics.

In the above arrangement, of the dielectric layers which make up the dielectric substrate, the dielectric layer between the shield electrode and the lower surface of the dielectric substrate may have a dielectric constant $\in r>20$.

In this case, since the shield electrode in the dielectric substrate and the wiring pattern on the wiring board can be electrically connected to each other through a capacitance, it is not necessary to provide an external terminal corresponding to the shield electrode on the lower surface of the dielectric substrate. Generally, if the passive component is to be reduced in size, the dimensions of the terminal needs to be reduced. Inasmuch as an external terminal corresponding to the shield electrode does not need to be provided, the terminal can have a large area and hence increased mechanical strength.

If the passive circuit disposed in the dielectric substrate is a filter having at least one resonator, then the resonator may be provided by a via hole, and one of end faces of the via hole may have a short-circuiting end and an open end.

As described above, the passive component according to the present invention can solve various problems caused by side mounting, characteristic variations can effectively be reduced, and manufacturing steps can effectively be simplified.

DETAILED DESCRIPTION OF THE INVENTION

Embodiments of passive components according to the present invention will be described below with reference to FIGS. 1 through 8.

Figure 1:
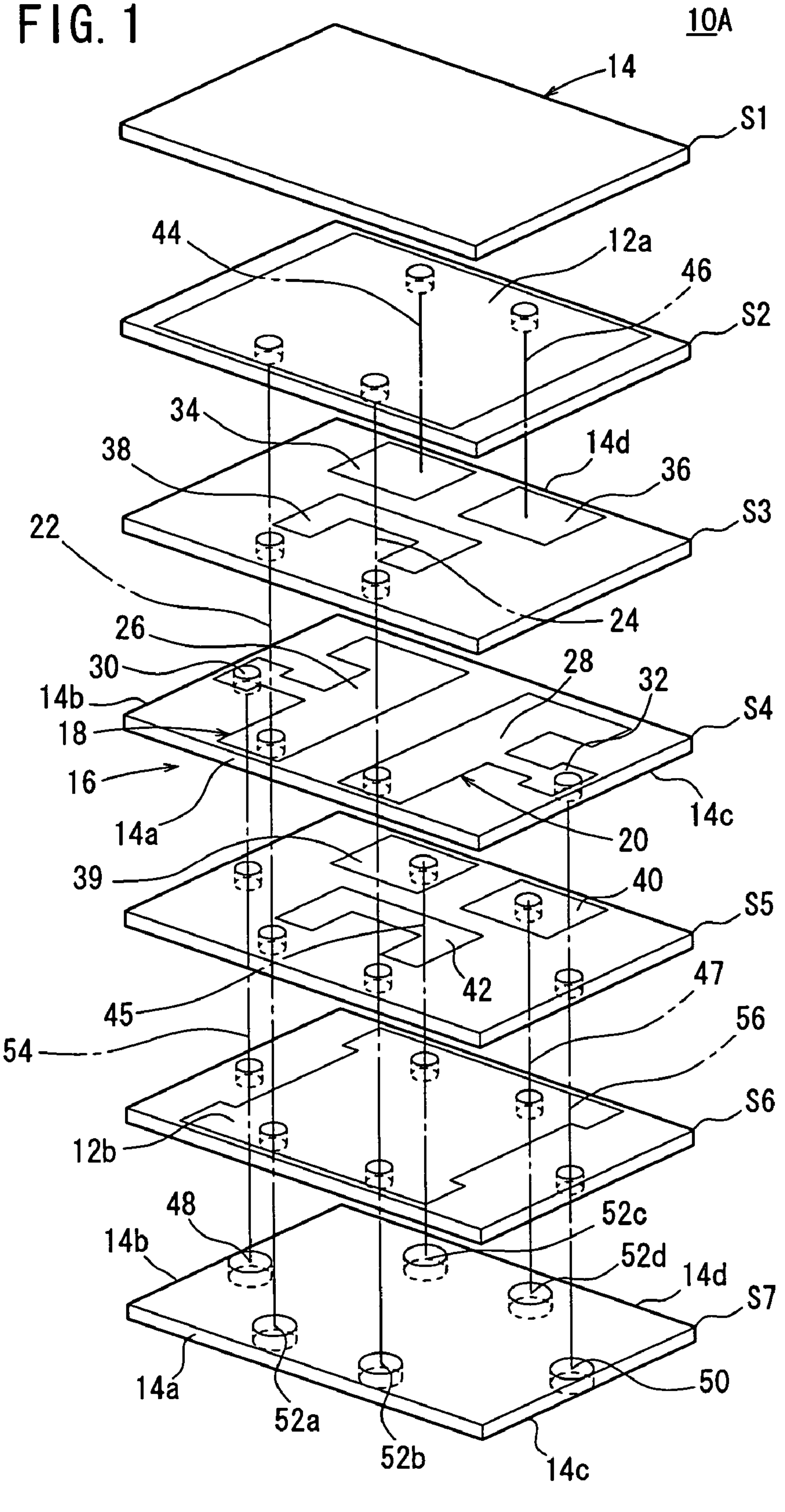
FIG. 1 is an exploded perspective view of a passive component according to a first embodiment.
Figure 2:
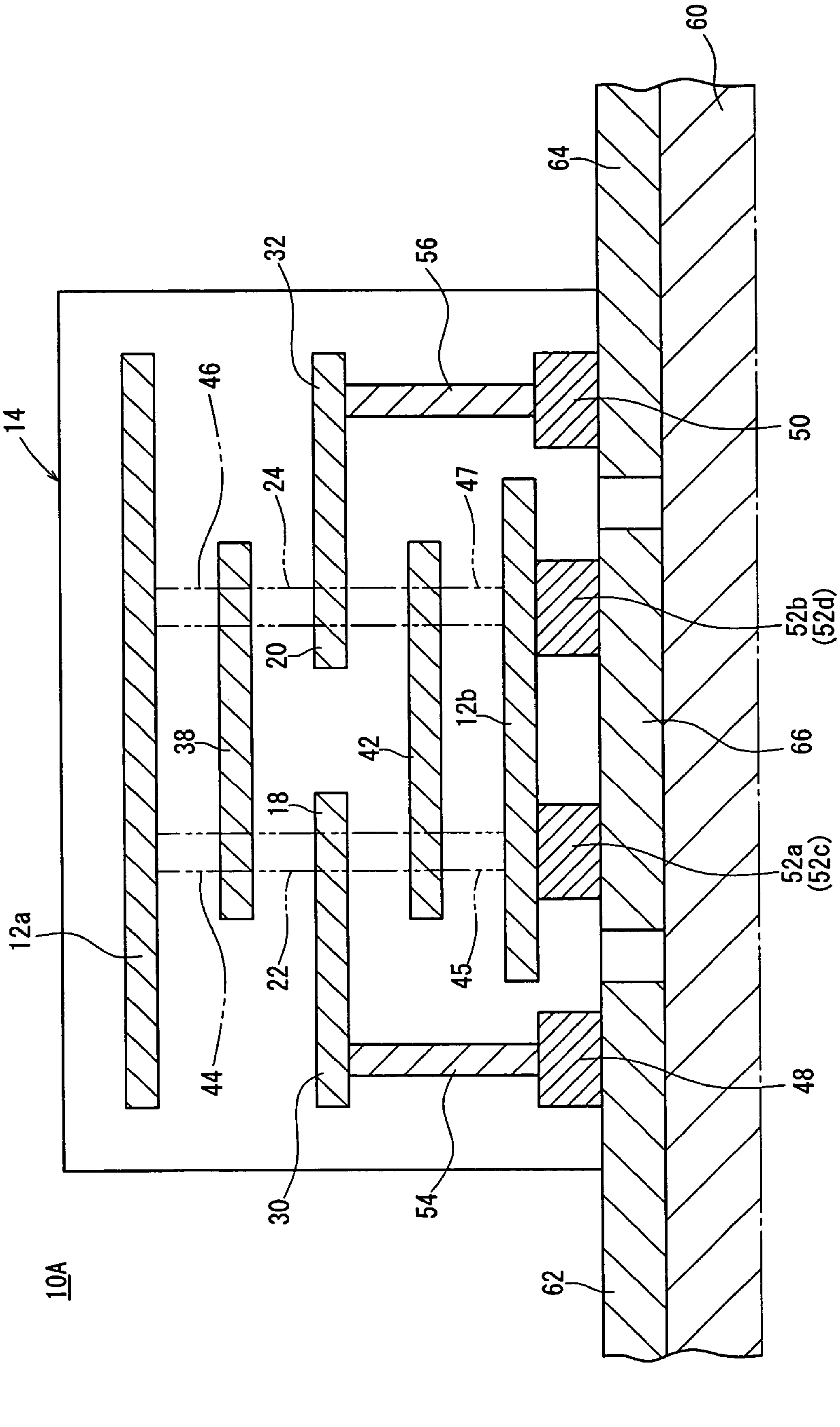
FIG. 2 is a vertical cross-sectional view of the passive component according to the first embodiment.

As shown in FIGS. 1 and 2, a passive component 10A according to a first embodiment has a dielectric substrate 14 including a plurality of dielectric layers (S1, S2, S3, S4, S5, S6, S7) stacked and sintered together and inner-layer shield electrodes 12*a*, 12*b* disposed respectively on a principal surface of the second dielectric layer S2 and a principal surface of the sixth dielectric layer S6.

The dielectric substrate 14 is constructed by successively stacking the first through seventh dielectric layers S1 through S7. Each of the first through seventh dielectric layers S1, S2, S3, S4, S5, S6, S7 comprise a single layer or a plurality of layers.

The dielectric substrate 14 includes a filter 16 providing two ¼-wavelength resonators (an input resonator 18 and an output resonator 20). The filter 16 has an input resonant electrode 26 and an output resonant electrode 28 which are disposed on a principal surface of the fourth dielectric layer S4.

An end of the input resonant electrode 26 (an end disposed in a position close to a first side surface 14*a* of the dielectric substrate 14) and an end of the output resonant electrode 28 (an end disposed in a position close to the first side surface 14*a*) are electrically connected to the inner-layer shield electrodes 12*a*, 12*b* respectively through via holes 22, 24. The end of the input resonant electrode 26 and the end of the output resonant electrode 28 thus serve as short-circuiting ends.

An input tap electrode 30 extends from a central area of the input resonant electrode 26 toward a second side surface 14*b* of the dielectric substrate 14 (a side surface remote from the output resonant electrode 28). An output tap electrode 32 extends from a central area of the output resonant electrode 28 toward a third side surface 14*c* of the dielectric substrate 14 (a side surface remote from the second side surface 14*b*).

The third dielectric layer S3 has, on a principal surface thereof, inner-layer shield electrodes 34, 36 confronting respective open ends of the input resonant electrode 26 and the output resonant electrode 28 and disposed closely to a fourth side surface 14*d* of the dielectric substrate 14 (a side surface remote from the first side surface 14*a*), and a coupling adjustment electrode 38 for adjusting the degree of coupling between the input resonator 18 and the output resonator 20.

The fifth dielectric layer S5 has, on a principal surface thereof, inner-layer shield electrodes 39, 40 confronting the respective open ends of the input resonant electrode 26 and the output resonant electrode 28 and disposed closely to the fourth side surface 14*d* of the dielectric substrate 14, and a coupling adjustment electrode 42 for adjusting the degree of coupling between the input resonator 18 and the output resonator 20.

The inner-layer shield electrode 12*a* is electrically connected to the inner-layer shield electrodes 34, 36 through via holes 44, 46 extending through the second dielectric layer S2 in the vicinity of the fourth side surface 14*d* of the dielectric substrate 14. The inner-layer shield electrode 12*b* is electrically connected to the inner-layer shield electrodes 39, 40 through via holes 45, 47 extending through the fifth dielectric layer S5 in the vicinity of the fourth side surface 14*d* of the dielectric substrate 14.

Of the dielectric layers that make up the dielectric substrate 14 of the passive component 10A according to the first embodiment, the lowermost dielectric layer S7 has an input electrode layer 48 serving as an input terminal, an output electrode layer 50 serving as an output terminal, and four shield electrode layers 52*a*, 52*b*, 52*c* and 52*d* serving as shield terminals, which are in the form of via holes.

The input electrode layer 48 is disposed in the vicinity of the second side surface 14*b* of the dielectric substrate 14. The output electrode layer 50 is disposed in the vicinity of the third side surface 14*c* of the dielectric substrate 14. Of the four shield electrode layers 52*a*, 52*b*, 52*c*, 52*d* the two shield electrode layers 52*a*, 52*b* are disposed in the vicinity of the first side surface 14*a* of the dielectric substrate 14, and the other two shield electrode layers 52*c*, 52*d* are disposed in the vicinity of the fourth side surface 14*d* of the dielectric substrate 14.

The input electrode layer 48 is electrically connected to the input resonant electrode 26 through a via hole 54 extending through the fourth through sixth dielectric layers S4, S5, S6 and the input tap electrode 30 in the second side surface 14*b* of the dielectric substrate 14. The output electrode layer 50 is electrically connected to the output resonant electrode 28 through a via hole 56 extending through the fourth through sixth dielectric layers S4, S5, S6 and the output tap electrode 32 in the third side surface 14*c* of the dielectric substrate 14.

The two shield electrode layers 52*a*, 52*b* are electrically connected to the inner-layer shield electrodes 12*a*, 12*b* and the short-circuiting ends of the input resonant electrode 26 and the output resonant electrode 28 through the via holes 22, 24. The other two shield electrode layers 52*c*, 52*d* are electrically connected to the inner-layer shield electrodes 39, 40, 12*b* through the via holes 45, 47.

The diameters of the input electrode layer 48, the output electrode layer 50, and the four shield electrode layers 52*a*, 52*b*, 52*c*, 52*d* are greater than the diameters of the via holes 22, 24, 44, and 46.

With the passive component 10A according to the first embodiment, as described above, the input electrode layer 48 serving as the input terminal, the output electrode layer 50 serving as the output terminal, and the four shield electrode layers 52*a*, 52*b*, 52*c*, 52*d* serving as the shield terminals are disposed as via holes in the lowermost dielectric layer S7. Therefore, the input terminal, the output terminal, and the shield terminals are provided only on the lower surface of the dielectric substrate 14.

When the passive component 10A is to be mounted on a wiring board or the like, for example, the terminals disposed only on the lower surface of the dielectric substrate 14 may be mounted on the wiring board by a surface mounting process. Therefore, the mounting area of the passive component 10A may be smaller than if it is mounted by a side mounting process.

Since the input terminal, the output terminal, and the shield terminals are provided only on the lower surface of the dielectric substrate 14, the distances between these terminals and the electrodes of the filter 16 are large enough to make it less liable to produce stray capacitances between the terminals and the electrodes. Therefore, the isolation characteristics of the passive component 10A are improved.

As no electrodes need to be formed on the side surfaces of the passive component 10A, the passive component 10A can be manufactured by simple manufacturing steps at a reduced cost.

The passive component 10A is less susceptible to shields disposed closely thereto and other adjacent components, and suffers smaller characteristic variations.

With the passive component 10A according to the first embodiment, in particular, the input electrode layer 48, the output electrode layer 50, and the shield electrode layers 52*a* through 52*d* are provided as via holes in the dielectric substrate 14. Consequently, these electrode layers are prevented from peeling off from the dielectric substrate 14, and cracking of each of the electrode layers is reduced.

Since the electrode layers 48, 50, 52*a* through 52*d* can be formed simultaneously with the via holes 22, 24, 44, 45, 46, and 47 in the dielectric substrate 14, the step of forming the terminals on the lower surface of the dielectric substrate 14 is dispensed with, resulting in simplified manufacturing steps. As the thickness of the electrode layers 48, 50, 52*a* through 52*d* can be increased, they can have the same mechanical strength as conventional side terminals (terminals disposed on side surfaces of the dielectric substrate 14).

Particularly, inasmuch as the diameters of the electrode layers 48, 50, 52*a*52*b*, 52*c*, 52*d* are greater than the diameters of the via holes 22, 24, 44, 45, 46, and 47, as shown in FIG. 2, the area in which an input wiring pattern 62 on a wiring board 60 and the input electrode layer 48 face each other, the area in which an output wiring pattern 64 and the output electrode layer 50 face each other, and the area in which a shield wiring pattern 66 and the shield electrode layers 52*a*, 52*b*, 52*c*, 52*d* face each other are increased to suppress an unwanted inductive component from forming.

A passive component 10B according to a second embodiment will be described below with reference to FIGS. 3 and 4.

Figure 3:
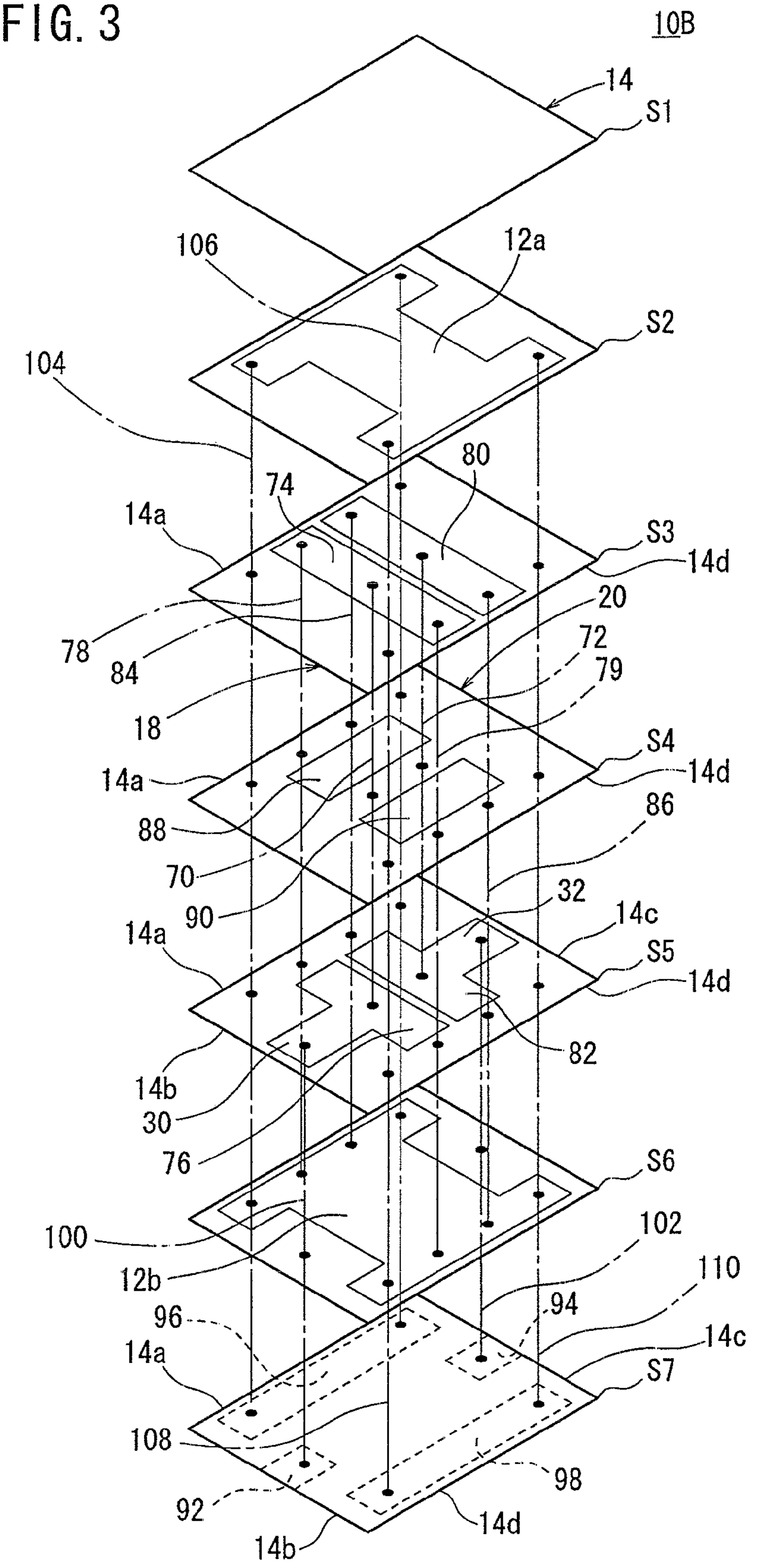
FIG. 3 is an exploded perspective view of a passive component according to a second embodiment.
Figure 4:
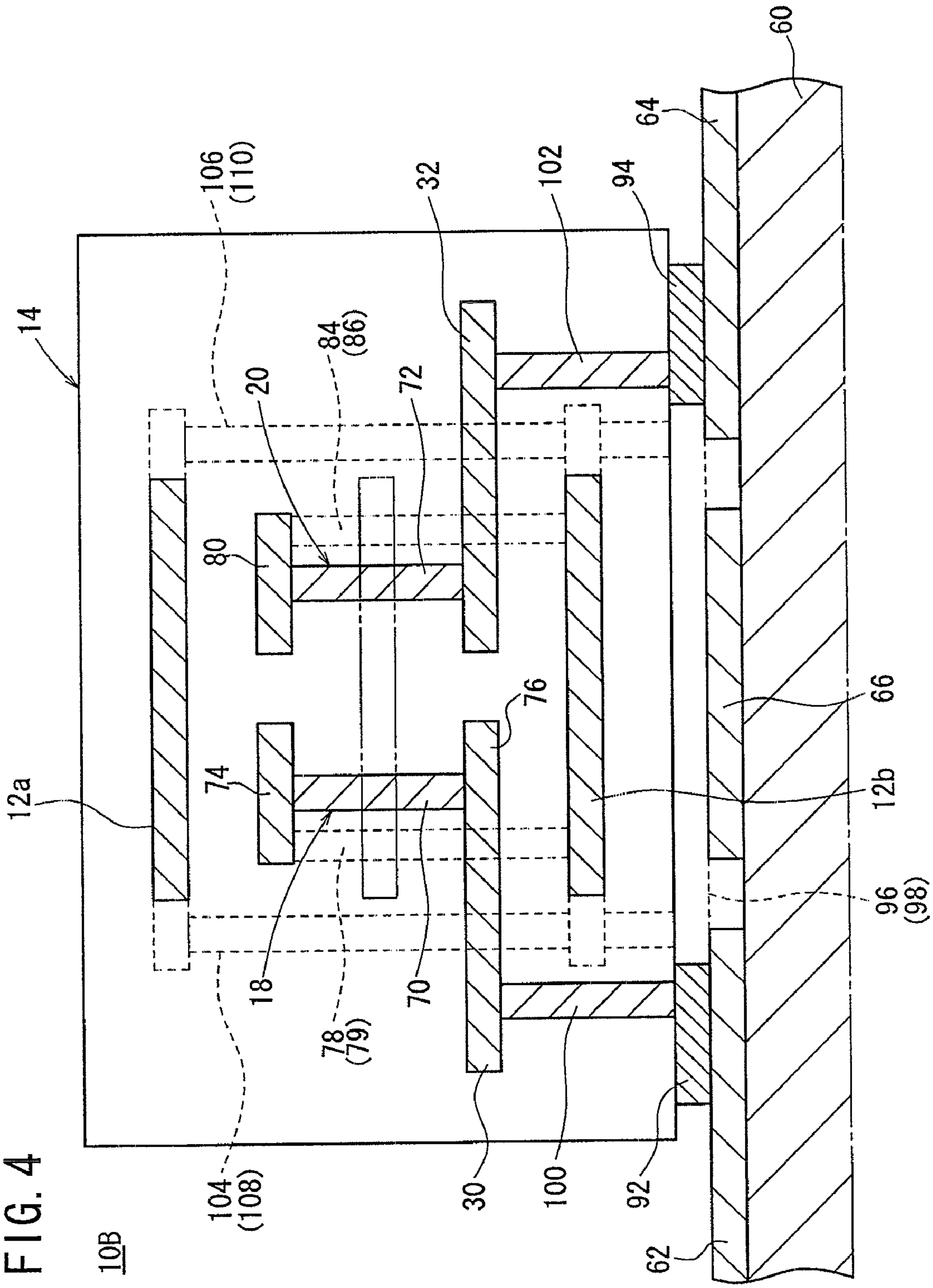
FIG. 4 is a vertical cross-sectional view of the passive component according to the second embodiment.

As shown in FIGS. 3 and 4, the passive component 10B according to the second embodiment is of essentially the same structure as the passive component 10A according to the first embodiment, but differs therefrom in that the input resonator 18 and the output resonator 20 are constructed of via holes 70, 72. Repeat descriptions of like elements are deleted.

Specifically, as shown in FIG. 3, the input resonator 18 has a first electrode 74 extending on a principal surface of the third dielectric layer S3 from a region close to the first side surface 14*a* to a region close to the fourth side surface 14*d*, a second electrode 76 extending on a principal surface of the fifth dielectric layer S5 from a region close to the first side surface 14*a* to a region close to the fourth side surface 14*d*, and a via hole 70, referred to above, extending through the third and fourth dielectric layers S3, S4 and interconnecting a central portion of the first electrode 74 and a central portion of the second electrode 76.

The first electrode 74 has opposite ends electrically connected to the inner-layer shield electrode 12*b* through respective via holes 78, 79. The second electrode 76 has an input tap electrode 30 extending from a central portion thereof toward the second side surface 14*b* of the dielectric substrate 14. The first electrode 74 thus provides a short-circuiting end of the input resonator 18. The second electrode 76 faces the inner-layer shield electrode 12*b* with the dielectric layer interposed therebetween, and provides an open end of the input resonator 18.

As with the input resonator 18, the output resonator 20 has a first electrode 80 extending on a principal surface of the third dielectric layer S3 from a region close to the first side surface 14*a* to a region close to the fourth side surface 14*d* and providing a short-circuiting end of the output resonator 20, a second electrode 82 extending on a principal surface of the fifth dielectric layer S5 from a region close to the first side surface 14*a* to a region close to the fourth side surface 14*d* and providing an open end of the output resonator 20, and a via hole 72, referred to above, extending through the third and fourth dielectric layers S3, S4 and interconnecting the first electrode 80 and the second electrode 82.

The first electrode 80 has opposite ends electrically connected to the inner-layer shield electrode 12*b* through respective via holes 84, 86. The second electrode 82 has the output tap electrode 32 extending from a central portion thereof toward the third side surface 14*c* of the dielectric substrate 14.

The fourth dielectric layer S4 has, on a principal surface thereof, a first coupling adjustment electrode 88 disposed near the first side surface 14*a* of the dielectric substrate 14 and confronting the first electrode 74 of the input resonator 18 and the first electrode 80 of the output resonator 20 with the third dielectric layer S3 interposed therebetween, and a second coupling adjustment electrode 90 disposed near the fourth side surface 14*d* of the dielectric substrate 14 and confronting the first electrode 74 of the input resonator 18 and the first electrode 80 of the output resonator 20 with the third dielectric layer S3 interposed therebetween.

The passive component 10B according to the second embodiment has a single input electrode film 92 serving as an input terminal, a single output electrode film 94 serving as an output terminal, and two shield electrode films 96, 98 serving as shield terminals, on the reverse side of the seventh dielectric layer S7 (the lower surface of the dielectric substrate 14).

The input electrode film 92 is disposed in the vicinity of the second side surface 14*b* of the dielectric substrate 14, and the output electrode film 94 is disposed in the vicinity of the third side surface 14_c_ of the dielectric substrate 14. Of the two shield electrode films 96, 98, the shield electrode film 96 is disposed in the vicinity of the first side surface 14_a_ of the dielectric substrate 14 and extends from a region close to the second side surface 14_b_ to a region close to the third side surface 14_c_. The other shield electrode film 98 is disposed in the vicinity of the fourth side surface 14_d_ of the dielectric substrate 14 and extends from a region close to the second side surface 14_b_ to a region close to the third side surface 14_c_.

The input electrode film 92 is electrically connected to the second electrode 76 of the input resonator 18 through a via hole 100 extending through the fifth and sixth dielectric layers S5, S6 and the input tap electrode 30 in the vicinity of the second side surface 14_b_ of the dielectric substrate 14. The output electrode film 94 is electrically connected to the second electrode 82 of the output resonator 20 through a via hole 102 extending through the fifth and sixth dielectric layers S5, S6 and the output tap electrode 32 in the vicinity of the third side surface 14_c_ of the dielectric substrate 14.

The shield electrode film 96 is electrically connected to the inner-layer shield electrodes 12_a_, 12_b_ through via holes 104, 106 extending through the second through seventh dielectric layers S2 through S7 in the vicinity of the first side surface 14_a_ of the dielectric substrate 14. The other shield electrode film 98 is electrically connected to the inner-layer shield electrodes 12_a_, 12_b_ through via holes 108, 110 extending through the second through seventh dielectric layers S2 through S7 in the vicinity of the fourth side surface 14_d_ of the dielectric substrate 14.

Of the dielectric layers SI through S7 that make up the dielectric substrate 14, the sixth and seventh dielectric layers S6, S7 between the inner-layer shield electrode 12_b_ and the lower surface of the dielectric substrate 14 are made of a material having a dielectric constant ∈r (<20).

With the passive component 10B according to the second embodiment, the input electrode film 92 serving as the input terminal, the output electrode film 94 serving as the output terminal, and the shield electrode films 96, 98 serving as the shield terminals are disposed on the reverse side of the lowermost dielectric layer S7. Therefore, the input terminal, the output terminal, and the shield terminals are provided only on the lower surface of the dielectric substrate 14.

As with the first embodiment described above, the mounting area of the passive component 10B is smaller than if it is mounted by a side mounting process. The isolation characteristics of the passive component 10B are improved. The passive components 10B can be manufactured by simple manufacturing steps at a reduced cost, and suffers smaller characteristic variations.

Particularly, of the dielectric layers S1 through S7 that make up the dielectric substrate 14, the dielectric constant ∈r of the sixth and seventh dielectric layers S6, S7 between the inner-layer shield electrode 12_b_ and the lower surface of the dielectric substrate 14 is ∈r<20. Therefore, stray capacitances between the inner-layer shield electrode 12_b_ and the input terminals and the output terminals are reduced, thereby improving the isolation characteristics.

Furthermore, the input resonator 18 and the output resonator 20 are constructed of the via holes 70, 72. The short-circuiting end of the input resonator 18 is constructed of the first electrode 74 on an end of the via hole 70, and the open end of the input resonator 18 is constructed of the second electrode 76 on the other end of the via hole 70. The short-circuiting end of the output resonator 20 is constructed of the first electrode 80 on an end of the via hole 72, and the open end of the output resonator 20 is constructed of the second electrode 82 on the other end of the via hole 72. Therefore, the following advantages are obtained.

The portions which need capacitances in the input resonator 18 and the output resonator 20, e.g., the third dielectric layer S3 between the first and second coupling adjustment electrodes 88, 90 and the first electrodes 74, 80, and the fourth dielectric layer S4 between the first and second coupling adjustment electrodes 88, 90 and the second electrodes 76, 82 are made of a material having a dielectric constant ∈r (>20), and the other dielectric layers are made of a material having a high Q value. Therefore, the Q values of the input resonator 18 and the output resonator 20 are increased to provide low-loss characteristics.

A passive component 10C according to a third embodiment will be described below with reference to FIG. 5.

Figure 5:
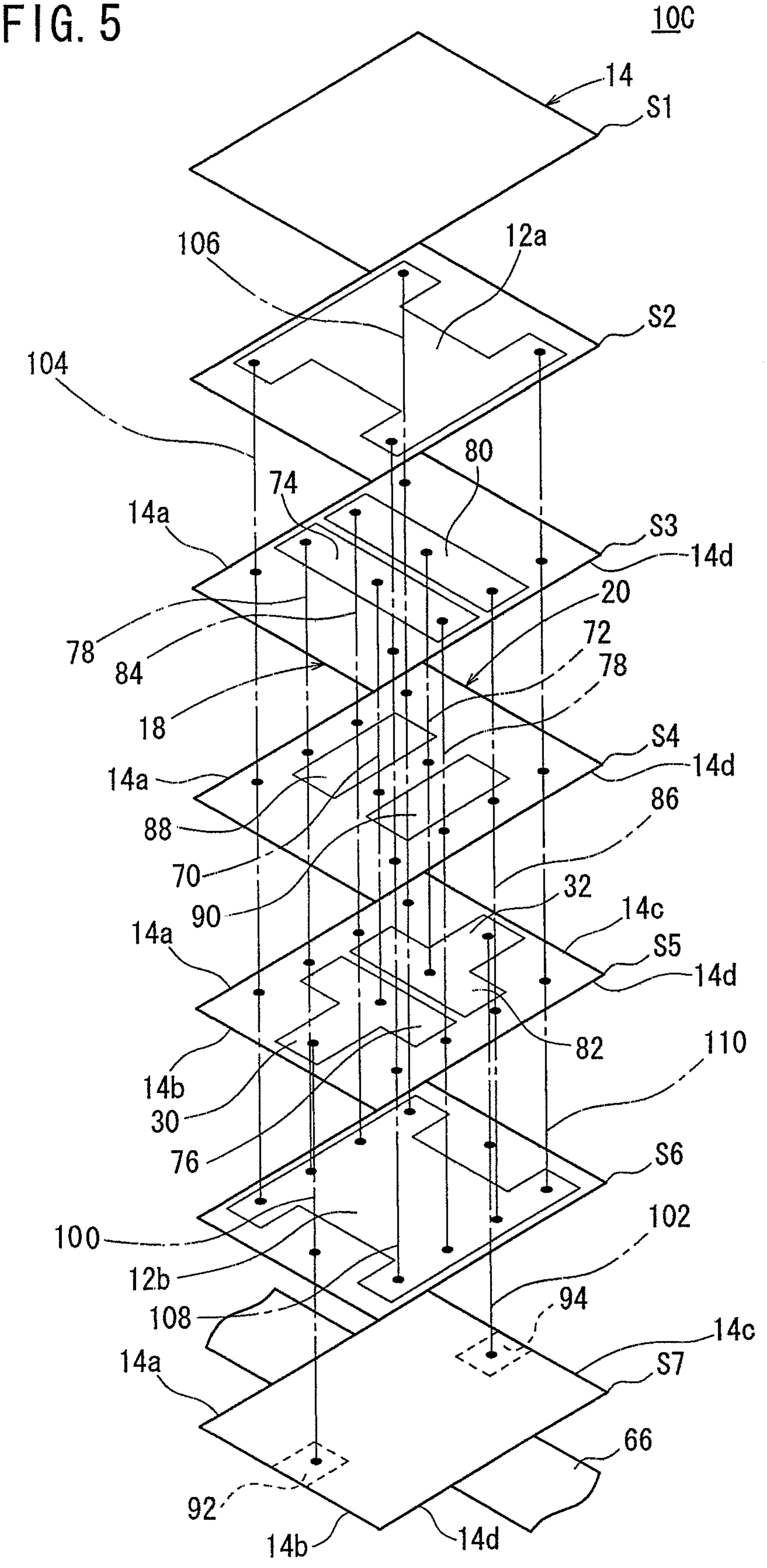
FIG. 5 is an exploded perspective view of a passive component according to a third embodiment.

As shown in FIG. 5, the passive component 10C according to the third embodiment is of essentially the same structure as the passive component 10B according to the second embodiment, but differs therefrom in that the shield electrode films 96, 98 (see FIG. 3) are not disposed on the lower surface of the dielectric substrate 14, and, of the dielectric layers S1, S2, S3, S4, S5, S6, S7 that make up the dielectric substrate 14, the sixth and seventh dielectric layers S6, S7 between the inner-layer shield electrode 12_b_ and the lower surface of the dielectric substrate 14 are made of a material having a dielectric constant ∈r (>20). Repeat descriptions of like elements are omitted.

The inner-layer shield electrode 12_b_ in the dielectric substrate 14 and the shield wiring pattern 66 on the wiring board 60 can be electrically connected to each other through a capacitance.

Therefore, the shield electrode films 96, 98 (see FIG. 3) serving as the shield terminals do not need to be provided on the lower surface of the dielectric substrate 14. Generally, if the passive component is to be reduced in size, the input terminal, the output terminal, and the shield terminals have to be of reduced dimensions. According to the third embodiment, since the shield electrode films 96, 98 do not need to be provided, the input electrode film 92 and the output electrode film 94 can have increased dimensions and hence increased mechanical strength.

A passive component 10D according to a fourth embodiment will be described below with reference to FIG. 6.

Figure 6:
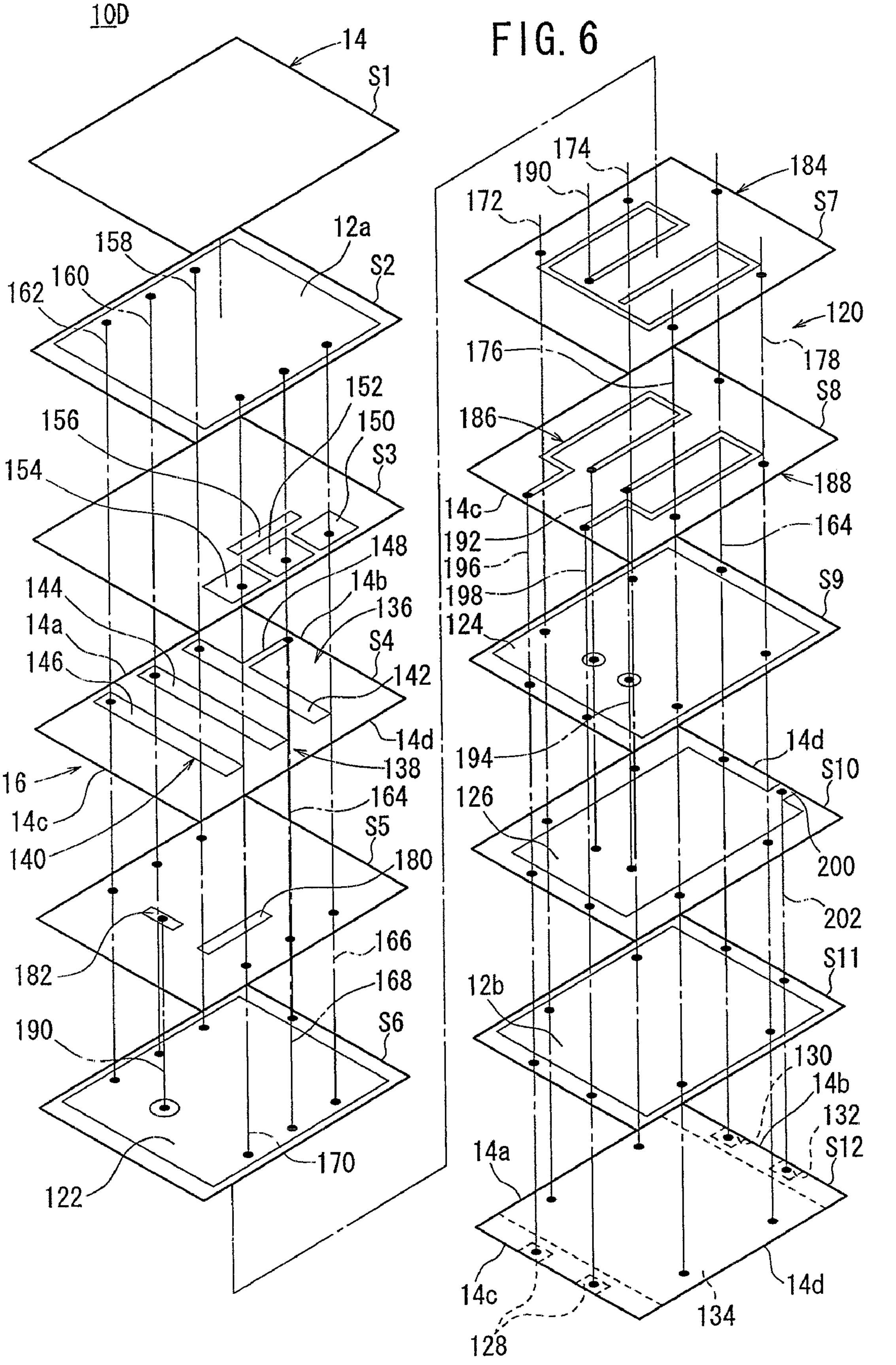
FIG. 6 is an exploded perspective view of a passive component according to a fourth embodiment.

As shown in FIG. 6, the passive component 10D according to the fourth embodiment is of essentially the same structure as the passive component 10A according to the first embodiment, but differs therefrom in that the dielectric substrate 14 has the filter 16 and an unbalanced-to-balanced converter 120 (hereinafter simply referred to as a converter) disposed therein.

The passive component 10D according to the fourth embodiment has inner-layer shield electrodes 12_a_, 122, 124, and 12_b_ disposed respectively on principal surfaces of a second dielectric layer S2, a sixth dielectric layer S6, a ninth dielectric layer S9, and an eleventh dielectric layer S11, and a DC electrode 126 disposed on a principal surface of a tenth dielectric layer S10. A twelfth dielectric layer S12 has, on a lower surface thereof, balanced input and output terminals 128 disposed in the vicinity of the third side surface 14_c_ of the dielectric substrate 14, unbalanced input and output terminals 130 and a DC terminal 132 disposed in the vicinity of the second side surface 14_b_, and a shield terminal 134 disposed in a central region.

The fourth dielectric layer S4 has, on a principal surface thereof, first through third resonant electrodes 142, 144, 146 serving respectively as first through third resonators 136, 138, 140 and extending from a region close to the first side surface 14*a* of the dielectric substrate 14 to a region close to the fourth side surface 14*d* thereof, and a lead electrode 148 extending from the first resonant electrode 142 toward the second side surface 14*b*.

The third dielectric layer S3 has, on a principal surface thereof, three inner-layer shield electrodes 150, 152, 154 confronting respective open ends of the first through third resonant electrodes 142, 144, 146 and disposed in the vicinity of the fourth side surface 14*d* of the dielectric substrate 14, and a first coupling adjustment electrode 156 for adjusting the degree of coupling between the first and second resonators 136, 138.

The first through third resonant electrodes 142, 144, 146 have ends disposed closely to the first side surface 14*a* of the dielectric substrate 14 and connected to the inner-layer shield electrodes 12*a*, 122 through via holes 158, 160, 162 extending through the second through sixth dielectric layers S2 through S6.

The lead electrode 148 which extends from the first resonant electrode 142 has an end disposed closely to the second side surface 14*b* of the dielectric substrate 14 and connected to the unbalanced input and output terminals 130 on the lower surface of the dielectric substrate 14 through a via hole 164 extending through the fourth through twelfth dielectric layers S4 through S12.

The three inner-layer shield electrodes 150, 152, 154 are connected to the inner-layer shield electrodes 12*a*, 122 through via holes 166, 168, 170 extending through the second through sixth dielectric layers S2 through S6 in the vicinity of the fourth side surface 14*d* of the dielectric substrate 14.

The inner-layer shield electrode 122 is electrically connected to the inner-layer shield electrodes 124, 12*b* and the shield terminal 134 on the lower surface of the dielectric substrate 14 through via holes 172, 174 extending through the sixth through twelfth dielectric layers S6 through S12 in the vicinity of the first side surface 14*a* of the dielectric substrate 14 and via holes 176, 178 extending through the sixth through twelfth dielectric layers S6 through S12 in the vicinity of the fourth side surface 14*d* of the dielectric substrate 14.

The fifth dielectric layer S5 has, on a principal surface thereof, a second coupling adjustment electrode 180 for adjusting the degree of coupling between the second and third resonators 138, 140, and an output capacitance electrode 182 underlying the third resonant electrode 146 such that the fourth dielectric layer S4 interposed between the output capacitance electrode 182 and the third resonant electrode 146.

The seventh dielectric layer S7 has, on a principal surface thereof, a first stripline electrode 184 serving as the converter 120. The eighth dielectric layer S8 has, on a principal surface thereof, second and third stripline electrodes 186, 188 serving as the converter 120.

The first stripline electrode 184 has an end electrically connected to the output capacitance electrode 182 through a via hole 190 extending through the fifth and sixth dielectric layers S5, S6. The other end of the first stripline electrode 184 is open. The inner-layer shield electrode 122 has a region insulated from the via hole 190, i.e., a region where no electrode film is provided.

An end of the second stripline electrode 186 and an end of the third stripline electrode 188 are electrically connected to the DC electrode 126 through via holes 192, 194 extending through the eighth and ninth dielectric layers S8, S9. The inner-layer shield electrode 124 has a region insulated from the via holes 192, 194, i.e., a region where no electrode film is provided.

The other end of the second stripline electrode 186 and the other end of the third stripline electrode 188 are positioned near the third side surface 14*c* of the dielectric substrate 14 and electrically connected to the balanced input and output terminals 128 on the lower surface of the dielectric substrate 14 through via holes 196, 198 extending through the eighth through twelfth dielectric layers S8 through S12.

The DC electrode 126 has a protrusive electrode 200 projecting towards the second side surface 14*b* of the dielectric substrate 14. The protrusive electrode 200 is electrically connected to the DC terminal 132 on the lower surface of the dielectric substrate 14 through a via hole 202 extending through the tenth through twelfth dielectric layers S10 through S12.

With the passive component 10D according to the fourth embodiment, as with the first embodiment described above, the mounting area of the passive component 10D may be smaller than if it is mounted by a side mounting process. The isolation characteristics of the passive component 10D are improved. The passive components 10D can be manufactured by simple manufacturing steps at a reduced cost, and suffers smaller characteristic variations.

A passive component 10E according to a fifth embodiment will be described below with reference to FIG. 7.

Figure 7:
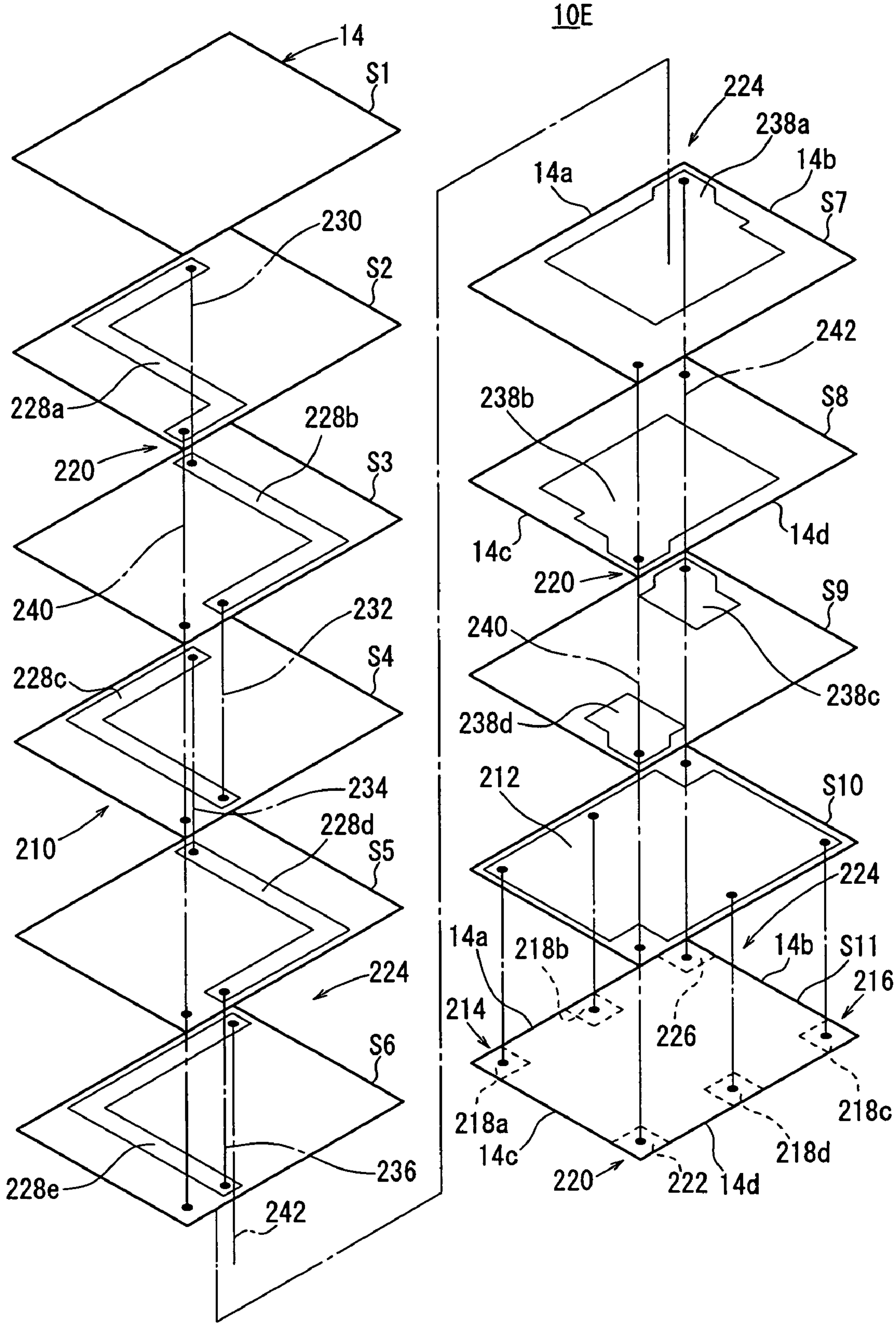
FIG. 7 is an exploded perspective view of a passive component according to a fifth embodiment.

As shown in FIG. 7, the passive component 10E according to the fifth embodiment is of essentially the same structure as the passive component 10A according to the first embodiment, but differs therefrom in that the dielectric substrate 14 has a filter of lumped-constant circuit 210 therein. Repeat descriptions of like elements are omitted.

The passive component 10E according to the fifth embodiment has an inner-layer shield electrode 212 disposed on a principal surface of the tenth dielectric layer S10. On the lower surface of the eleventh dielectric layer S11, there are disposed shield terminals 218*a*, 218*b*, 218*c*, 218*d* respectively in a corner 214 including the first and third side surfaces 14*a*, 14*c* of the dielectric substrate 14, a region including a central portion of the first side surface 14*a*, a corner 216 including the second and fourth side surfaces 14*b*, 14*d*, and a region including a central portion of the fourth side surface 14*d*, an input terminal 222 in a corner 220 including the third and fourth side surfaces 14*c*, 14*d* of the dielectric substrate 14, and an output terminal 226 in a corner 224 including the first and second side surfaces 14*a*, 14*b* of the dielectric substrate 14.

The second through fifth dielectric layers S2, S3, S4 and S5 have, on principal surfaces thereof, first through fifth inductive electrodes 228*a*, 228*b*, 228*c*, 228*d*, 228*e* for providing inductance. The first through fifth inductive electrodes 228*a*, 228*b*, 228*c*, 228*d* and 228*e* are connected and formed into a coil by via holes 230, 232, 234, 236.

The seventh through ninth dielectric layers S7, S8 and S9 have, on principal surfaces thereof, first through fourth capacitive electrodes 238*a*, 238*b*, 238*c*, 238*d* for providing capacitance.

The first capacitive electrode 238*a* is disposed on the principal surface of the seventh dielectric layer S7 near the corner 224 including the first and second side surfaces 14*a*, 14*b* of the dielectric substrate 14. The second capacitive electrode 238*b* is disposed on the principal surface of the eighth dielectric layer S8 near the corner 220 including the third and fourth side surfaces 14*c*, 14*d* of the dielectric substrate 14.

The third capacitive electrode 238*c* is disposed on the principal surface of the ninth dielectric layer S9 near the corner 224 of the dielectric substrate 14. The fourth capacitive electrode 238*d* is disposed on the principal surface of the ninth dielectric layer S9 near the corner 220.

The first inductive electrode 228*a* has an end positioned on the second dielectric layer S2 in the vicinity of the corner 220, and is connected to the second capacitive electrode 238*b*, the fourth capacitive electrode 238*d*, and the input terminal 222 on the lower surface of the dielectric substrate 14 through a via hole 240 extending through the second through eleventh dielectric layers S2 through S11.

The fifth inductive electrode 228*e* has an end positioned on the sixth dielectric layer S6 in the vicinity of the corner 224, and is connected to the first capacitive electrode 238*a*, the third capacitive electrode 238*c*, and the output terminal 226 on the lower surface of the dielectric substrate 14 through a via hole 242 extending through the sixth through eleventh dielectric layers S6 through S11.

With the passive component 10E according to the fifth embodiment, as with the first embodiment described above, the mounting area of the passive component 10E may be smaller than if it is mounted by a side mounting process. The isolation characteristics of the passive component 10E are improved. The passive components 10E can be manufactured by simple manufacturing steps at a reduced cost, and suffers smaller characteristic variations.

Figure 8:
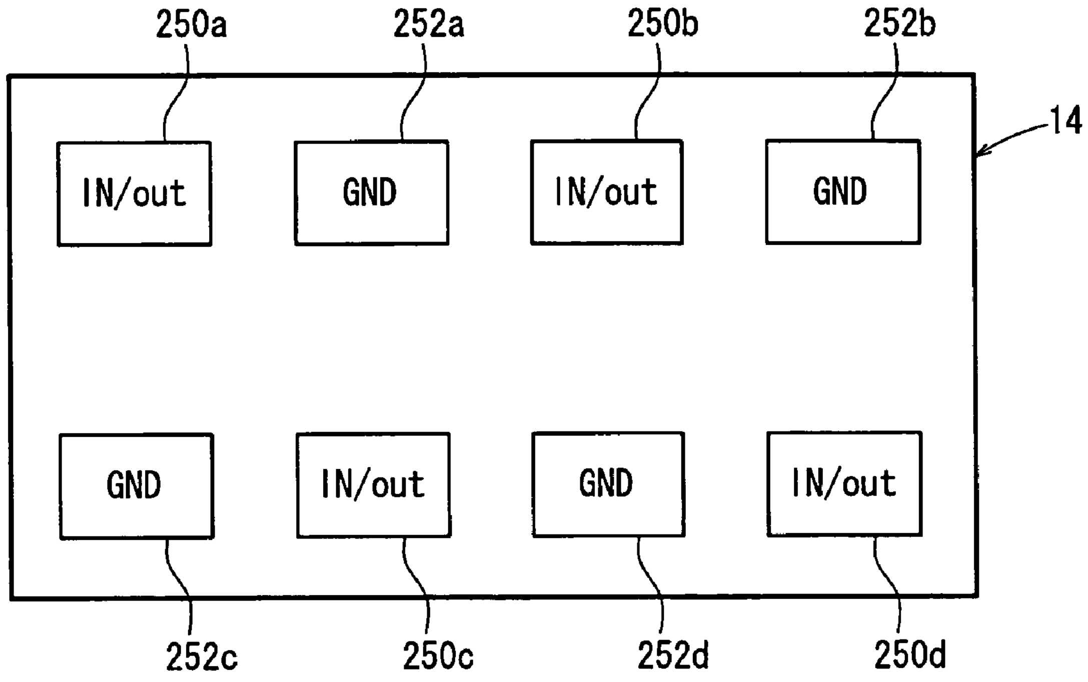
FIG. 8 is a view showing by way of example a pattern of terminals disposed on the lower surface of a dielectric substrate.

With the passive component 10E according to the fifth embodiment, of the six terminals 218*a* through 218*d*, 222, 226 on the lower surface of the dielectric substrate 14, the input terminal 222 and the output terminal 226 are located diagonally opposite to each other, and the shield terminals 218*a* through 218*d* are located in other regions. However, as shown in FIG. 8, if eight terminals (input and output terminals in/out) 250*a*, 250*b*, 250*c*, 250*d*, and shield terminals (GND) 252*a*, 252*b*, 252*c*, 252*d*), or example, are disposed on the lower surface of the dielectric substrate 14, then the input and output terminals 250*a*, 250*b*, 250*c*, 250*d* and the shield terminals 252*a*, 252*b*, 252*c*, 252*d* may be arranged in a checkerboard pattern.

Since the input and output terminals 250*a* through 250*d* are spaced away from each other and the shield terminals 252*a* through 252*d* are disposed adjacent to the input and output terminals 250*a* through 250*d*, it is possible to keep the input and output terminals 250*a* through 250*d* isolated from each other.

The passive component according to the present invention is not limited to the above embodiments, but may take on various forms without departing from the scope of the invention.

The invention claimed is:

1. A passive component mounted on a wiring board including at least a shield wiring pattern, said passive component comprising a plurality of internal electrodes and one or more terminals, said plurality of internal electrodes serving as a passive circuit disposed in a dielectric substrate comprising a plurality of stacked dielectric layers, said one or more terminals being disposed in an outer surface of said dielectric substrate;

wherein said one or more terminals are input and output terminals of said passive circuit, and all of said one or more terminals are provided only on a lower surface of said dielectric substrate;

wherein an internal electrode for shielding is disposed in said dielectric substrate, and said shield wiring pattern of said wiring board faces said lower surface of said dielectric substrate; and wherein said internal electrode for shielding and said shield wiring pattern of the wiring board are electrically connected to each other through a capacitance.

2. The passive component according to claim 1, wherein said passive component further comprises at least one resonator, and said at least one resonator comprises two electrodes and a resonator via hole connecting said two electrodes, wherein one of said two electrodes defines a short-circuiting end of at least one resonator, and the other one of said two electrodes defines an open-circuit end of said at least one resonator.

3. The passive component according to claim 1, wherein, of said plurality of stacked dielectric layers of said dielectric substrate, a dielectric layer disposed between said internal electrode for shielding and said lower surface of said dielectric substrate has a dielectric constant of $\in r>20$.

4. A passive component comprising:

a plurality of internal electrodes constituting a filter disposed in a dielectric substrate comprising a plurality of stacked dielectric layers;

a plurality of internal electrodes constituting an unbalanced-to-balanced converter disposed in said dielectric substrate;

a terminal of said filter disposed in an outer surface of said dielectric substrate;

a terminal of said unbalanced-to-balanced converter; and terminals for shielding;

wherein all of said terminals are provided only on a lower surface of said dielectric substrate;

wherein, of said internal electrodes of said filter, a via hole connected to said terminal of said filter is located closely to a first side surface of said dielectric substrate along said first side surface of said dielectric substrate;

wherein of said internal electrodes of said unbalanced-to-balanced converter, a via hole connected to said terminal of said unbalanced-to-balanced converter is located closely to a second side surface of said dielectric substrate along said second side surface of said dielectric substrate; and wherein of said internal electrodes of said filter and said unbalanced-to-balanced converter, via holes connected to said terminals for shielding are located closely to a third side surface and a fourth side surface of said dielectric substrate along said third and fourth side surfaces of said dielectric substrate.

5. The passive component according to claim 4, wherein an internal electrode for shielding is disposed in said dielectric substrate, and wherein a dielectric layer disposed between said internal electrode for shielding and said lower surface of said dielectric substrate has a dielectric constant of $\in r<20$.

6. The passive component according to claim 4, wherein said filter further comprises at least one resonator, and said at least one resonator comprises two electrodes and a resonator via hole connecting said two electrodes, wherein one of said two electrodes defines a short-circuiting end of said at least one resonator, the other one of said two electrodes defines an open-circuit end of said at least one resonator.

7. A passive component including a plurality of internal electrodes and one or more terminals, said plurality of internal electrodes serving as a passive circuit disposed in a dielectric substrate comprising a plurality of stacked dielectric layers, said one or more terminals being disposed in an outer surface of said dielectric substrate;

wherein said internal electrodes corresponding to said one or more terminals are electrically connected to each other through a corresponding connecting via hole disposed in said dielectric substrate;

wherein all of said one or more terminals are provided only on a lower surface of said dielectric substrate, each of said one or more terminals comprising a via hole for terminals exposed on a lower surface of said dielectric substrate; and wherein a diameter of said via hole for terminals is greater than a diameter of said connecting via hole.

8. The passive component according to claim 7, wherein said passive component further comprises at least one resonator, and said at least one resonator comprises two electrodes and a resonator via hole connecting said two electrodes, wherein one of said two electrodes defines a short-circuiting end of said at least one resonator, and the other one of said two electrodes defines an open-circuit end of said at least one resonator.

9. The passive component according to claim 7, wherein an internal electrode for shielding is disposed in said dielectric substrate, and, of said plurality of dielectric layers of said dielectric substrate, a dielectric layer disposed between said internal electrode for shielding and said lower surface of said dielectric substrate has a dielectric constant of $\in r<20$.

* * * * *